United States Patent
Kim

(10) Patent No.: US 12,024,052 B2
(45) Date of Patent: Jul. 2, 2024

(54) METHOD FOR DETECTING LOW VOLTAGE CELL AND BATTERY MANAGEMENT SYSTEM FOR PROVIDING THE METHOD

(71) Applicant: LG Energy Solution, Ltd., Seoul (KR)

(72) Inventor: Uiseong Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 74 days.

(21) Appl. No.: 17/637,917

(22) PCT Filed: Apr. 21, 2021

(86) PCT No.: PCT/KR2021/005022
§ 371 (c)(1),
(2) Date: Feb. 24, 2022

(87) PCT Pub. No.: WO2021/215824
PCT Pub. Date: Oct. 28, 2021

(65) Prior Publication Data
US 2022/0281349 A1  Sep. 8, 2022

(30) Foreign Application Priority Data
Apr. 22, 2020 (KR) .................. 10-2020-0048646

(51) Int. Cl.
*B60L 58/12* (2019.01)
*G01R 31/3842* (2019.01)
*H01M 10/42* (2006.01)

(52) U.S. Cl.
CPC .......... *B60L 58/12* (2019.02); *G01R 31/3842* (2019.01); *H01M 10/425* (2013.01);
(Continued)

(58) Field of Classification Search
CPC ............... B60L 58/12; B60L 2240/547; G01R 31/3842; G01R 31/396; G01R 31/3835;
(Continued)

(56) References Cited

U.S. PATENT DOCUMENTS

| 8,463,563 B2 * | 6/2013 | Tae ..................... G01R 31/3842 702/65 |
| 2008/0036421 A1 | 2/2008 | Seo et al. |

(Continued)

FOREIGN PATENT DOCUMENTS

| CN | 102136744 A | 7/2011 |
| CN | 104849667 A | 8/2015 |

(Continued)

OTHER PUBLICATIONS

English translation of JP 2015231301, Dec. 21, 2015. (Year: 2015).*
(Continued)

*Primary Examiner* — Michael P Nghiem
(74) *Attorney, Agent, or Firm* — Lerner David LLP

(57) ABSTRACT

A low voltage cell detecting method and a battery management system includes a cell monitoring IC connected to respective ends of a plurality of battery cells and measuring a cell voltage and a battery current of the respective battery cells, and a main control circuit for calculating states of charge (SOCs) of the respective battery cells based on at least one of the measured cell voltages and the battery currents of the battery cells. The main control circuit compares a difference value between first SOCs of the battery cells calculated before a service of a vehicle terminates and second SOCs of the battery cells calculated when the service of the vehicle resumes to a predetermined discharging threshold value, determines whether the battery cells respectively have a low voltage according to the comparison, and detects a low voltage cell.

10 Claims, 2 Drawing Sheets

(52) U.S. Cl.
CPC ............... *B60L 2240/547* (2013.01); *H01M 2010/4271* (2013.01)

(58) Field of Classification Search
CPC .............. G01R 31/382; H01M 10/425; H01M 2010/4271; H02J 7/0048
USPC .......................................................... 702/63
See application file for complete search history.

(56) References Cited

U.S. PATENT DOCUMENTS

| | | |
|---|---|---|
| 2008/0054850 A1 | 3/2008 | Tae et al. |
| 2008/0084187 A1 | 4/2008 | Cutrona |
| 2011/0095765 A1 | 4/2011 | Tae et al. |
| 2011/0181246 A1 | 7/2011 | Tae et al. |
| 2011/0184677 A1 | 7/2011 | Tae et al. |
| 2011/0234169 A1 | 9/2011 | Yoshikawa |
| 2011/0309840 A1 | 12/2011 | Yamaguchi |
| 2013/0234672 A1 | 9/2013 | Kubota et al. |
| 2013/0253781 A1 | 9/2013 | Li |
| 2015/0234015 A1 | 8/2015 | Park |
| 2015/0355286 A1 | 12/2015 | Kobayashi et al. |
| 2019/0113580 A1 | 4/2019 | Tenmyo et al. |
| 2021/0296911 A1 | 9/2021 | Itakura et al. |
| 2023/0148088 A1* | 5/2023 | Lee .................... G01R 31/396 702/63 |

FOREIGN PATENT DOCUMENTS

| | | | |
|---|---|---|---|
| CN | 107947268 A | 4/2018 | |
| EP | 2348599 A1 | 7/2011 | |
| EP | 2365352 A1 | 9/2011 | |
| JP | 2008062913 A | 3/2008 | |
| JP | 2011154016 A | 8/2011 | |
| JP | 2011205863 A | 10/2011 | |
| JP | 2012139043 A | 7/2012 | |
| JP | 5240244 B2 | 7/2013 | |
| JP | 2015231301 A * | 12/2015 | ............... H02J 7/14 |
| JP | 2016199153 A | 12/2016 | |
| KR | 100709260 B1 | 4/2007 | |
| KR | 101057547 B1 | 8/2011 | |
| KR | 20110087569 A | 8/2011 | |
| KR | 20130086233 A | 7/2013 | |
| KR | 20130091692 A | 8/2013 | |
| KR | 101769182 B1 | 8/2017 | |
| KR | 20190049997 A | 5/2019 | |
| WO | 2012081620 A1 | 6/2012 | |
| WO | 2014115513 A1 | 7/2014 | |
| WO | 2017217092 A1 | 12/2017 | |
| WO | 2020021889 A1 | 1/2020 | |

OTHER PUBLICATIONS

Extended European Search Report including Written Opinion for Application No. 21793736.6 dated Nov. 14, 2022, pp. 1-7.
International Search Report for PCTKR2021005022 dated Jul. 29, 2021, 2 pgs.

* cited by examiner

METHOD FOR DETECTING LOW VOLTAGE CELL AND BATTERY MANAGEMENT SYSTEM FOR PROVIDING THE METHOD

CROSS-REFERENCE TO RELATED APPLICATIONS

The present application is a national phase entry under 35 U.S.C. § 371 of International Application No. PCT/KR2021/005022 filed Apr. 21, 2021, published in Korean, which claims priority from Korean Patent Application No. 10-2020-0048646 filed Apr. 22, 2020, all of which are incorporated herein by reference.

TECHNICAL FIELD

The present invention relates to a method for detecting a low voltage cell hindering stability of a battery from among a plurality of battery cells and a battery management system for providing the same.

BACKGROUND ART

Vehicles using an internal combustion engine using gasoline or diesel as a main seriously influence generation of pollutants such as air pollution. Therefore, to reduce the generation of pollutants, electric vehicles or hybrid vehicles are developed.

The electric vehicles use a battery engine operable by electrical energy output by a battery. Such electric vehicles use the battery in which a plurality of battery cells that may be repeatedly charged and discharged are made into a battery module or a battery pack as a main power source. Accordingly, the electric vehicles generate no exhaust gas, and also have a merit in reducing noise.

The hybrid vehicles are positioned in the middle range of the vehicles using an internal combustion engine and the electric vehicles, and they use a plurality of power sources, for example, an internal combustion engine and a battery motor. Currently, mixed types of hybrid vehicles, for example, using a fuel cell for directly obtaining electrical energy while continuously supplying hydrogen and oxygen and generating a chemical reaction with the internal combustion engine, or using the battery and the fuel cell, are developed.

It is very important for the vehicles using electrical energy to manage the battery that is a power source. It is needed to control charging/discharging of the battery or connecting to the battery before an abnormal phenomenon occurs in the battery and the battery may ignite.

Meanwhile, from among a plurality of battery cells configuring the battery, there may be a low voltage cell with a voltage value that is lower than a specific value for many reasons. When the low voltage cell is included, the entire voltage of the battery is lowered, and many cell balancings and undervoltage (UV) diagnoses are generated to threaten the entire stability of the battery.

SUMMARY

The present invention has been made in an effort to provide a method for detecting a low voltage cell based on a variation of a state of charge (SOC) before service of a plurality of battery cells of vehicles and after the service of the vehicle starts, and a battery management system for providing the same.

An embodiment of the present invention provides a method for detecting a low voltage cell in a method for detecting a low voltage cell of a battery system including a plurality of battery cells and a battery management system for managing the battery cells, including: extracting, by a main control unit, for each battery cell, a respective first SOC calculated at a first time before service of a vehicle terminates; extracting, by the main control unit, for each battery cell, a respective second SOC calculated at a second time when the service of the vehicle resumes; calculating, by the main control unit, for each battery cell, a difference value between the first SOC of the battery cell and the second SOC of the battery cell; comparing, by the main control unit, the calculated difference value with a predetermined discharging threshold value; and detecting, by the main control unit, which of the plurality of batteries is a low voltage cell based on a result of the comparison, wherein the discharging threshold value is based on a SOC variation of a normal cell for a period in which a service of the vehicle is ceased.

The discharging threshold value may be based on a stop period in which the service of the vehicle is ceased, a first SOC reduction rate caused by discharging of the battery cell for the stop period, and a second SOC reduction rate caused by energy consumption of the battery management system.

The discharging threshold value may be a product of the stop period, an error correcting value, and a sum of the first SOC reduction rate and the second SOC reduction rate.

The method may further include, before comparing the calculated difference value with the predetermined discharging threshold value, comparing the stop period to a critical period, and detecting the low voltage cell in response to the stop period being equal to or greater than the critical period.

The critical period may be a minimum period for calculating a difference value between the first SOC and the second SOC.

Detecting the low voltage cell may be in response to the difference value between the first SOC and the second SOC being equal to or greater than the discharging threshold value.

Another embodiment of the present invention provides a battery management system in a system for managing a battery by detecting a low voltage cell, including: a cell monitoring integrated circuit (IC) connected to respective ends of a plurality of battery cells and configured to monitor a respective cell voltage and a respective battery current of each of the battery cells; and a main control circuit configured to calculate, for each battery cell, a respective first state of charge (SOC) based on at least one of the cell voltage or the battery current of the battery cell at a first time before service of a vehicle terminates; calculate, for each battery cell, a respective second SOC based on at least one of the cell voltage or the battery current of the battery cell at a second time when service of the vehicle resumes; calculate, for each battery cell, a difference value between the first SOC of the battery cell and the second SOC of the battery cell; compare, for each battery cell, the calculated difference value with a predetermined discharging threshold value; and detect which of the plurality of batteries is a low voltage cell based on a result of the comparison, and wherein the discharging threshold value is based on a SOC variation of a normal cell for a period in which service of the vehicle terminates.

The discharging threshold value may be based on a stop period in which the service of the vehicle is terminated, a first SOC reduction rate caused by discharging of the battery cell for the stop period, and a second SOC reduction rate caused by energy consumption of the battery management system.

The discharging threshold value may be a product of the stop period, the error correcting value, and a sum of the first SOC reduction rate and the second SOC reduction rate.

The main control circuit may be configured to compare the stop period to a critical period, and detect the low voltage cell in response to the stop period being equal to or greater than the critical period.

The critical period may be a minimum period for calculating a difference value between the first SOC and the second SOC.

The main control circuit may be configured to detect the low voltage cell in response to the difference value between the first SOC and the second SOC of the low voltage cell being equal to or greater than the discharging threshold value.

The present invention may increase the stability of the battery by quickly detecting the low voltage cell with high precision.

DETAILED DESCRIPTION

Figure 1:
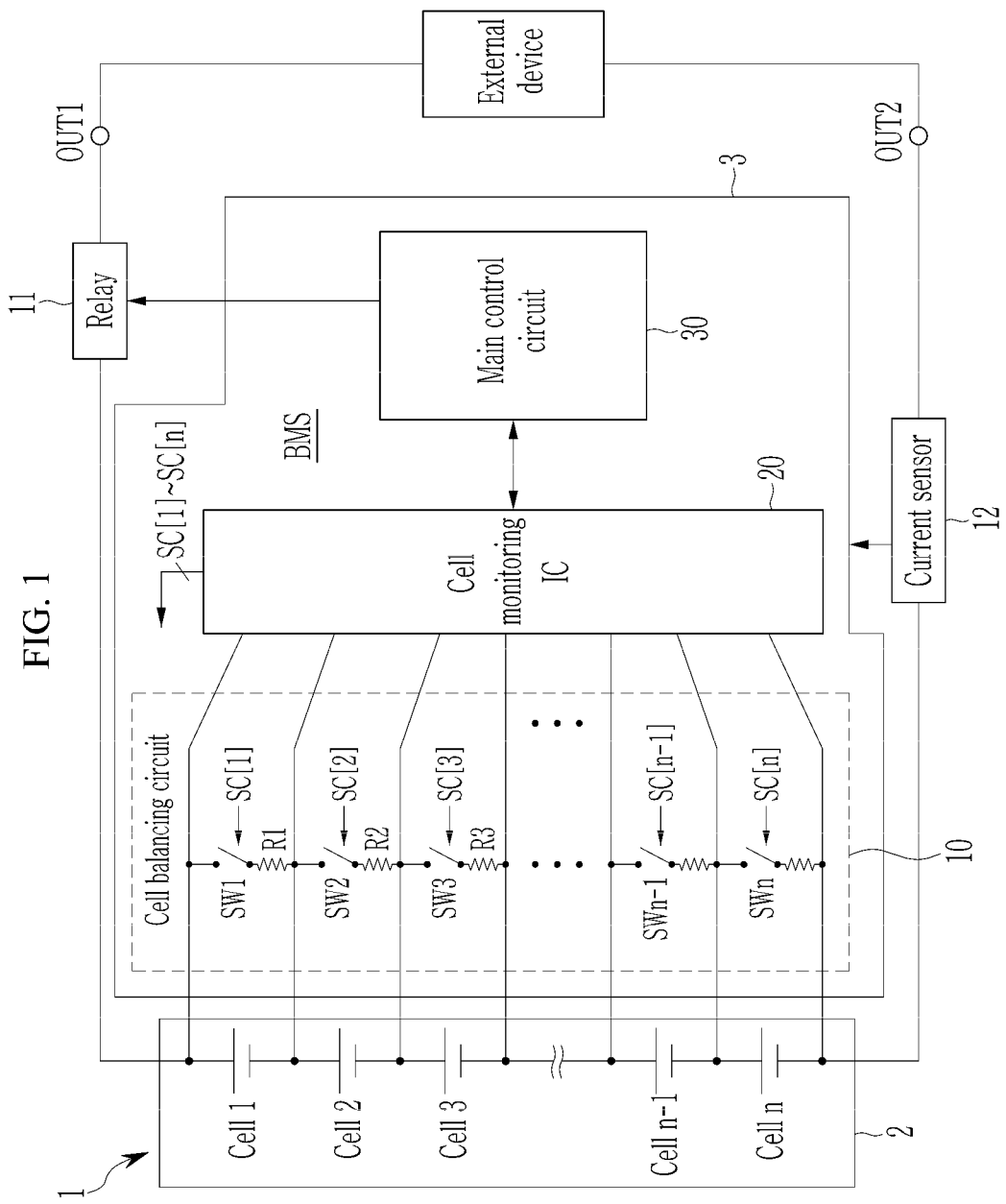
FIG. 1 shows a battery system according to an embodiment.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not interpreted as limiting these components. The terms are only used to differentiate one component from others.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected or coupled to another component without the other component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 shows a battery system according to an embodiment.

As shown in FIG. 1, the battery system 1 includes a battery pack 2, a battery management system (BMS) 3, a relay 11, and a current sensor 12.

The battery pack 2 includes a plurality of battery cells (Cell1 to Celln) electrically connected to each other. In an embodiment, the battery cell may be a rechargeable battery. A predetermined number of battery cells may be connected in series to configure a battery module, and a predetermined number of battery modules may be connected in series and in parallel to configure a battery pack 2 and thereby supply a desired power voltage.

The battery cells (Cell1 to Celln) are respectively electrically connected to the BMS 3 through wires. The BMS 3 may collect and analyze various types of battery cell information on information of the battery cells (Cell1 to Celln) to control charging and discharging of the battery cell, a cell balancing, and a protection operation, and may control an operation of the relay 11. For example, the BMS 3 may collect and analyze various types of information on the battery cells (Cell1 to Celln) to detect a low voltage cell.

Referring to FIG. 1, the battery pack 2 includes the battery cells (Cell1 to Celln) connected in series and is connected between two output ends (OUT1) and (OUT2) of the battery system 1, the relay 11 is connected between a positive electrode of the battery system 1 and the output end (OUT1), and the current sensor 12 is connected between a negative electrode of the battery system 1 and the output end (OUT2). The constitutional elements and a connection relationship among them shown in FIG. 1 are examples and are not limited thereto.

The relay 11 controls electrical connections between the battery system 1 and an external device. When the relay 11 is turned on, the battery system 1 is electrically connected to the external device to perform a charging or discharging process, and when the relay 11 is turned off, the battery system 1 is electrically disconnected from the external device. The external device may be a load or a charger.

The current sensor 12 is connected in series to a current path between the battery pack 2 and the external device. The current sensor 12 may measure a current flowing to the battery pack 2, which is a charging current and a discharging current, and may transmit measurement results to the BMS 3.

The BMS 3 includes a cell balancing circuit 10, a cell monitoring IC 20, and a main control circuit 30.

The cell balancing circuit 10 includes a plurality of switches (SW1 to SWn) and a plurality of resistors (R1-Rn). The respective switches (SW1 to SWn) are switched according to a corresponding switching signal from among a plurality of switching signals (SC[1] to SC[n]) supplied by the cell monitoring IC 20. For the respective battery cells (Cell1 to Celln), the corresponding switch (SWi) and the resistor (Ri) are connected in series between the positive electrode and the negative electrode of the corresponding cell (Celli). When the switch (SWi) is turned on, a discharge path is formed among the corresponding cell (Celli), the switch (SWi), and the resistor (Ri), and the corresponding cell (Celli) is discharged. In this instance, i is one of natural numbers of 1 to n.

The cell monitoring IC 20 is electrically connected to the positive electrode and the negative electrode of the respective battery cells (Cell1 to Celln) to measure the cell voltage. A current value (hereinafter, a battery current) measured by the current sensor 12 may be transmitted to the cell monitoring IC 20. The cell monitoring IC 20 transmits information on the measured cell voltage and the battery current to the main control circuit 30. In detail, the cell monitoring IC 20 may measure cell voltages of the respective battery cells (Cell1 to Celln) for respective predetermined periods and may calculate a battery current based on the measured cell voltages for a rest period in which the charging and discharging is not generated. The cell monitoring IC 20 transmits a cell voltage and a battery current of the respective battery cells (Cell1 to Celln) to the main control circuit 30.

The cell monitoring IC 20 may discharge a cell balancing target cell from among a plurality of battery cells (Cell1 to Celln) through the cell balancing circuit 10 according to a cell balancing control signal transmitted by the main control circuit 30. For example, the cell monitoring IC 20 may generate a plurality of switching signals (SC[1] to SC[n]) according to a cell balancing control signal of the main control circuit 30. The respective switching signals (SC[1] to SC[n]) may control a switching operation of the corresponding switch (SWi). When an On-level switching signal (SC[i]) is supplied to the corresponding switch (SWi), the switch (SWi) is turned on and the corresponding cell (Celli) is discharged.

For example, when there is a low voltage cell having a voltage that is lower than a predetermined reference voltage from among a plurality of battery cells (Cell1 to Celln), the cell monitoring IC 20 performs frequent cell balancing by control of the main control circuit 30. When there is a low voltage cell and cell balancing is frequently performed, safety of the battery pack 2 is impaired.

The main control circuit 30 may calculate a state of charge (SOC) based on at least one of the cell voltage and the battery current of the respective battery cells (Cell1 to Celln). When the service of the vehicle terminates and the BMS 3 enters a sleep mode, the main control circuit 30 stores a finally calculated SOC, that is, a first SOC from among the respective SOCs of the battery cells (Cell1 to Celln). When the service of the electric vehicle resumes and the BMS 3 wakes up, the main control circuit 30 is synchronized with a resuming time of the service of the electric vehicle and calculates respective SOCs of the battery cells (Cell1 to Celln). The SOC calculated for the first time after the electric vehicle resumes the service is a second SOC.

The main control circuit 30 finds a difference between the first SOC and the second SOC of the respective battery cells (Cell1 to Celln). When a difference value between the first SOC and the second SOC is equal to or greater than a predetermined discharging threshold value (K), the main control circuit 30 determines it to be a low voltage and detects the corresponding battery cell to be a low voltage cell. In this instance, the discharging threshold value (K) is based on a SOC variation of a normal cell for a period in which the service of the electric vehicle is terminated. The low voltage cell is a battery cell with a voltage that is less than a predetermined reference voltage, and the SOC variation for the period in which the service of the electric vehicle is terminated is greater than the SOC variation of the normal cell.

A method for detecting a low voltage cell of a main control circuit 30 and a battery management system 1 for providing the method will now be described with reference to FIG. 1 and FIG. 2.

Figure 2:
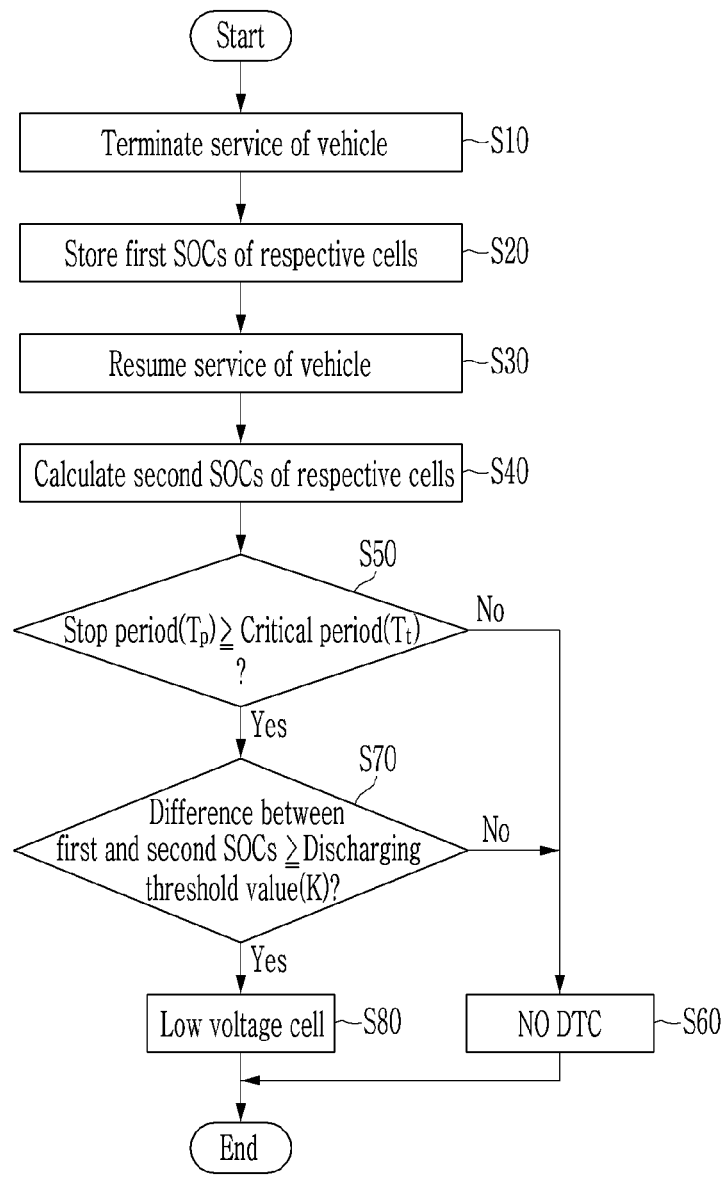
FIG. 2 shows a flowchart of a method for detecting a low voltage cell according to an embodiment.

FIG. 2 shows a flowchart of a method for detecting a low voltage cell according to an embodiment.

When the service of the electric vehicle terminates, the main control circuit 30 stores first SOCs of a plurality of battery cells (Cell1 to Celln) (S10) and (S20). In this instance, the first SOC represents the SOC finally calculated before the service of the electric vehicle terminates.

It is impossible to directly measure the SOC of the battery cell. Regarding a method for indirectly measuring the SOC of the battery cell, the SOC may be calculated by measuring a specific gravity and a PH of an electrolyte of the battery, the SOC may be calculated by measuring a voltage of the battery cell, the SOC may be calculated by measuring a battery current and integrating the same with respect to time, or the SOC may be calculated by using a property that an internal pressure of a NiMH battery is abruptly increased when charged. The main control circuit 30 may calculate the respective SOCs of a plurality of battery cells (Cell1 to Celln) by using various known methods for each predetermined period during a rest period in which no charging and discharging is generated, or may calculate the same in real time.

When the service of the electric vehicle resumes, the main control circuit 30 calculates respective second SOCs of the battery cells (Cell1 to Celln) and stores calculated results (S30) and (S40). In this instance, the second SOC is the SOC initially calculated after the service of the electric vehicle resumes.

When the service of the electric vehicle terminates, the BMS 3 enters the sleep mode and does not measure the voltage at the battery cell and does not calculate the SOC of the battery cell. When the service of the electric vehicle resumes, the BMS 3 wakes up and performs a normal operation. In this instance, the main control circuit 30 is synchronized with the time when the service of the electric vehicle resumes, calculates the SOCs of a plurality of battery cells (Cell1 to Celln), and stores results.

For example, after the service of the electric vehicle resumes, the main control circuit 30 may extract the stored first SOCs and the second SOCs of a plurality of battery cells (Cell1 to Celln) and may detect the low voltage cell based on the extraction.

The main control circuit 30 compares the period in which the service of the electric vehicle is ceased, that is, the stop period (Tp), and a critical period (Tt) (S50). When the period in which the service of the electric vehicle is ceased is very short, the SOC variation rate is small and it is difficult to detect the low voltage cell. In this instance, the critical period (Tt) is a minimum period for calculating a difference value between the first SOC and the second SOC. For example, when the stop period (Tp) becomes long, the difference value between the first SOC and the second SOC also increases.

When the stop period (Tp) of the electric vehicle is less than the critical period (Tt) (S50, No), the main control circuit 30 may determine that a diagnostic trouble code (DTC) is impossible (S60). In this instance, no diagnostic trouble code (NO DTC) may include a case in which no low voltage cell may be detected from among a plurality of battery cells (Cell1 to Celln) or a case in which there is no low voltage cell.

When the stop period (Tp) of the electric vehicle is equal to or greater than the critical period (Tt) (S50, Yes), the main control circuit 30 compares the difference value between the first SOC and the second SOC of the stored battery cells (Cell1 to Celln) and a predetermined discharging threshold value (K) (S70).

The discharging threshold values (K) may be based on the SOC variation of the normal cell for the period in which the service of the electric vehicle is ceased, that is, the stop period (Tp). For example, the discharging threshold value (K) may be calculated by a product of an error correcting value, the stop period, and a sum of a first SOC reduction rate caused by a discharge of the battery cell and a second SOC reduction rate caused by energy consumption of the BMS 3 for the stop period (Tp). In this instance, the first SOC reduction rate and the second SOC reduction rate may be produced as a mean value based on experimental data of a plurality of normal cells.

The first SOC reduction rate represents a SOC variation that is reduced per day when the battery pack 2 does not supply a power voltage to an external device and the battery cell uses energy. The second SOC reduction rate represents a SOC variation reduced per day from the battery cell when the battery pack 2 does not supply a power voltage to the external device and the BMS 3 uses energy. An error correcting value is a value for applying dispersion and errors to prevent erroneous diagnosis, and for example, it may be computed to 150% (1.5).

For example, when assuming that the first SOC reduction rate is 0.15 (SOC loss/Day), the second SOC reduction rate is 0.3 (SOC loss/Day), and the stop period (Tp) is 10 days, it may be calculated as the discharging threshold value (K)=(0.15+0.3, SOC loss/Day)×1.5×10 (Day)=0.675%.

When the difference value between the first SOC and the second SOC is equal to or greater than the discharging threshold value (K) (S70, Yes) according to a comparison result, the main control circuit 30 determines the comparison result to be a low voltage and detects a corresponding battery cell as a low voltage cell (S80).

For example, when the difference value between the first SOC and the second SOC of the first battery cell is 0.7% for 10 days of the stop period (Tp), the difference value of 0.7% is greater than the discharging threshold value (K) of 0.675%, so the main control circuit 30 determines it to be a low voltage, and detects the corresponding first battery cell to be a low voltage cell.

When the difference value between the first SOC and the second SOC is less than the discharging threshold value (K) (S70, No) according to the comparison result, the main control circuit 30 may not determine the comparison result to be a low voltage, and may determine a corresponding second battery cell to be a normal cell, that is, a no diagnostic trouble code (NO DTC) S60.

For example, when the difference value between the first SOC and the second SOC of the second battery cell for 10 days of the stop period (Tp) is 0.5%, the difference value of 0.5% is less than the discharging threshold value (K) of 0.675%, so the main control circuit 30 may not determine it to be a low voltage and may determine the corresponding second battery cell to be a normal cell.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A battery management system comprising:
an integrated circuit (IC) connected to respective ends of a plurality of battery cells and configured to monitor a respective cell voltage of each of the plurality of battery cells and receive information indicative of a battery current of the battery cells; and a main control circuit configured to:
calculate, for each of the plurality of battery cells, a respective first state of charge (SOC) based on at least one of the cell voltage or the battery current of the battery cell at a first time before service of a vehicle terminates;
calculate, for each of the plurality of battery cells, a respective second SOC based on at least one of the cell voltage or the battery current of each of the plurality of battery cells at a second time when service of the vehicle resumes;
calculate, for each of the plurality of battery cells, a difference value between the respective first SOC of each of the plurality of battery cells and the respective second SOC of each of the plurality of battery cells;
compare, for each of the plurality of battery cells, the calculated difference value with a predetermined discharging threshold value;
detect which of the plurality of battery cells is a low voltage cell based on a result of the comparison, wherein the discharging threshold value is based on an error correcting value, a stop period in which service of the vehicle is terminated, a first SOC reduction rate caused by discharging of the plurality of battery cells for the stop period, and a second SOC reduction rate caused by energy consumption of the battery management system; and
control charging and discharging of the plurality of battery cells based on a consideration of the detected low voltage cell.

2. The battery management system of claim 1, wherein the discharging threshold value is a product of (i) the stop period, (ii) the error correcting value, and (iii) a sum of the respective first SOC reduction rate and the respective second SOC reduction rate.

3. The battery management system of claim 2, wherein the main control circuit is configured to:
compare the stop period to a critical period; and
detect the low voltage cell in response to the stop period being equal to or greater than the critical period.

4. The battery management system of claim 3, wherein the critical period is a minimum period for calculating the difference value between the respective first SOC and the respective second SOC.

5. The battery management system of claim 4, wherein the main control circuit is configured to detect the low voltage cell in response to the difference value between the respective first SOC and the second respective SOC of the low voltage cell being equal to or greater than the discharging threshold value.

6. A method for detecting a low voltage cell of a battery system including a plurality of battery cells and a battery management system for managing the battery cells, the method comprising:
extracting, by a controller, for each of the plurality of battery cells, a respective first SOC calculated at a first time before service of a vehicle terminates;

extracting, by the controller, for each of the plurality of battery cells, a respective second SOC calculated at a second time when the service of the vehicle resumes;

calculating, by the controller, for each of the plurality of battery cells, a difference value between the respective first SOC of each of the plurality of battery cells and the respective second SOC of each of the plurality of battery cells;

comparing, by the controller, the calculated difference value with a predetermined discharging threshold value;

detecting, by the controller, which of the plurality of battery cells is a low voltage cell based on a result of the comparison, wherein the discharging threshold value is based on an error correcting value, a stop period in which service of the vehicle is terminated, a first SOC reduction rate caused by discharging of the battery cell for the stop period, and a second SOC reduction rate caused by energy consumption of the battery management system; and controlling, by the controller, charging and discharging of the plurality of battery cells based on a consideration of the detected low voltage cell.

7. The method of claim 6, wherein
the discharging threshold value is a product of (i) the stop period, (ii) the error correcting value, and (iii) a sum of the respective first SOC reduction rate and the respective second SOC reduction rate.

8. The method of claim 7, further comprising:
before comparing the calculated difference value with the predetermined discharging threshold value,
comparing the stop period to a critical period; and
detecting the low voltage cell in response to the stop period being equal to or greater than the critical period.

9. The method of claim 8, wherein
the critical period is a minimum period for calculating a difference value between the respective first SOC and the respective second SOC.

10. The method of claim 9, wherein
detecting the low voltage cell is in response to the difference value between the respective first SOC and the respective second SOC being equal to or greater than the discharging threshold value.

\* \* \* \* \*